(12) United States Patent
Chiou et al.

(10) Patent No.: US 10,727,294 B2
(45) Date of Patent: Jul. 28, 2020

(54) SEMICONDUCTOR DEVICES, METHODS OF MANUFACTURE THEREOF, AND CAPACITORS

(71) Applicant: Taiwan Semiconductor Manufacturing Company, Ltd., Hsinchu (TW)

(72) Inventors: Wen-Chih Chiou, Zhunan Township (TW); Shin-Puu Jeng, Hsinchu (TW); Ebin Liao, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 53 days.

(21) Appl. No.: 15/883,746

(22) Filed: Jan. 30, 2018

(65) Prior Publication Data

US 2018/0175137 A1 Jun. 21, 2018

Related U.S. Application Data

(62) Division of application No. 14/102,268, filed on Dec. 10, 2013, now Pat. No. 9,899,467.

(51) Int. Cl.
*H01L 49/02* (2006.01)
*H01L 23/522* (2006.01)
*H01L 23/525* (2006.01)
*H01L 23/532* (2006.01)
*H01L 27/02* (2006.01)
*H01L 27/08* (2006.01)

(52) U.S. Cl.
CPC .......... *H01L 28/40* (2013.01); *H01L 23/5223* (2013.01); *H01L 23/5226* (2013.01); *H01L 23/5256* (2013.01); *H01L 23/53295* (2013.01); *H01L 27/0248* (2013.01); *H01L 27/0805* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 3,909,672 A | 9/1975 | Lundquist et al. | |
| 9,899,467 B2 * | 2/2018 | Chiou | ..................... H01L 28/40 |
| 2010/0237465 A1 | 9/2010 | Stribley et al. | |
| 2013/0076478 A1 | 3/2013 | Christmann et al. | |
| 2013/0154071 A1 | 6/2013 | Haigh et al. | |

* cited by examiner

*Primary Examiner* — Robert K Carpenter
(74) *Attorney, Agent, or Firm* — Slater Matsil, LLP

(57) ABSTRACT

Semiconductor devices, methods of manufacture thereof, and capacitors are disclosed. In some embodiments, a semiconductor device includes a first capacitor and a protection device coupled in series with the first capacitor. A second capacitor is coupled in parallel with the first capacitor and the protection device.

20 Claims, 8 Drawing Sheets

SEMICONDUCTOR DEVICES, METHODS OF MANUFACTURE THEREOF, AND CAPACITORS

PRIORITY CLAIM AND CROSS-REFERENCE

This patent application is a divisional of U.S. application Ser. No. 14/102,268, filed on Dec. 10, 2013 and entitled "Semiconductor Devices, Methods of Manufacture Thereof, and Capacitors," which application is hereby incorporated by reference herein as if reproduced in its entirety.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Capacitors are elements that are used extensively in semiconductor devices for storing an electrical charge. Capacitors essentially comprise two conductive plates separated by an insulating or dielectric material. Capacitors are used in applications such as electronic filters, analog-to-digital converters, memory devices, control applications, and many other types of semiconductor device applications.

In some semiconductor devices, power lines and ground lines are routed to logic gates and other devices in integrated circuits. The current from a power supply flows through the power lines, logic gates, and finally to ground. During switching of the logic gates, a large amount of change in the current occurs within a short period of time. Decoupling capacitors are used to absorb these glitches during current switching. Decoupling capacitors are also used to maintain a constant voltage between the supply voltage and ground. The decoupling capacitors act as charge reservoirs that additionally supply current to circuits when required, to prevent momentary drops in the supplied voltage.

One type of decoupling capacitor used is referred to as a metal-insulator-metal (MIM) capacitor. A MIM capacitor has two metal layers and a dielectric insulator layer between the two metal layers. A capacitance is formed between the two metal layers. MIM capacitors are often fabricated in interconnect layers of a semiconductor device.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of some of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Some embodiments of the present disclosure are related to semiconductor devices that include large-area capacitors and methods of manufacture thereof. Novel large-area capacitors that include protection structures and devices will be described herein.

Figure 1:
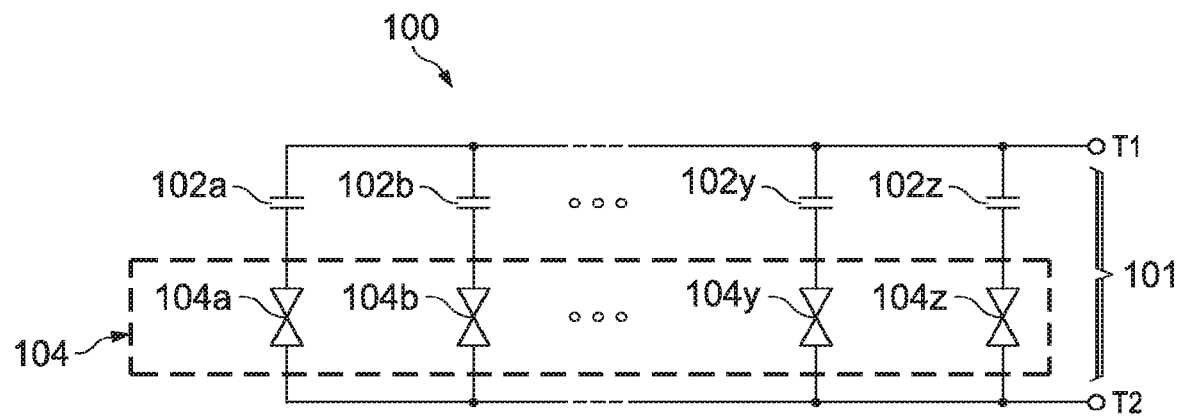
FIG. 1 is a schematic of a semiconductor device that includes a protection structure that comprises a plurality of protection devices for capacitors in accordance with some embodiments of the present disclosure.

FIG. 1 is a schematic of a semiconductor device 100 that includes a large-area capacitor 101 that includes a plurality of capacitors 102a, 102b . . . 102y, and 102z and a protection structure 104 in accordance with some embodiments. The protection structure 104 includes a plurality of protection devices 104a, 104b . . . 104y, and 104z for the capacitors 102a, 102b . . . 102y, and 102z in accordance with some embodiments of the present disclosure. Each of the plurality of protection devices 104a, 104b . . . 104y, and 104z is coupled in series with one of the plurality of capacitors 102a, 102b . . . 102y, and 102z in accordance with some embodiments, e.g., between a first terminal T1 and a second terminal T2. The protection devices 104a, 104b . . . 104y, and 104z of the protection structure 104 comprise redundant capacitors or fuses in some embodiments, which will be described further herein.

The large-area capacitor 101 of the semiconductor device 100 in some embodiments has an overall width and/or length in a top view of about a few hundred micrometers (μm) to about several centimeters (cm) in some embodiments. The large-area capacitor 101 includes about 1,000 or more of the capacitors 102a, 102b . . . 102y, and 102z and protection devices 104a, 104b . . . 104y, and 104z in some embodiments. Alternatively, the large-area capacitor 101 may comprise other dimensions and may include fewer than 1,000 of the capacitors 102a, 102b . . . 102y, and 102z and protection devices 104a, 104b . . . 104y, and 104z. The large-area capacitor 101 comprises a metal-insulator-metal (MIM) capacitor in some embodiments. The large-area capacitor 101 may be formed in a plurality of metallization layers of the semiconductor device 100, for example. The large-area capacitor 101 may comprise a decoupling capacitor in some applications. Alternatively, the large-area capacitor 101 may comprise other functions. The protection devices 104a, 104b . . . 104y, and 104z prevent failure of the large-area capacitor 101, to be described further herein.

A plurality of the protection devices 104a, 104b . . . 104y, and 104z is shown in FIG. 1; however, in accordance with some embodiments, only one protection device 104a is coupled to a single capacitor 102a in series between the two terminals T1 and T2. At least one of the other capacitors 102b . . . 102y, and 102z does not include a protection device 104b . . . 104y, and 104z coupled in series (not shown), in some embodiments. For example, in some embodiments, a semiconductor device 100 comprises a first capacitor 102a shown in FIG. 1, and a protection device 104a is coupled in series with the first capacitor 102a. A second capacitor 102b is coupled in parallel with the first capacitor 102a and the protection device 104a (e.g., the protection device 104b is not included, and the bottom plate of the second capacitor 102b is coupled to the second terminal T2). In embodiments wherein the protection device 104a comprises a redundant capacitor, the protection device 104a comprises a third capacitor, for example.

In other embodiments, a second protection device 104b is coupled in series with the second capacitor 102b as shown in FIG. 1, and the second capacitor 102b and the second protection device 104b are coupled in parallel with the first capacitor 102a and the first protection device 104a, also shown in FIG. 1.

In some embodiments, the large-area capacitor 101 comprises a capacitor having a plurality of first plates and a plurality of second plates. For example, in FIG. 1, each of the capacitors 102a, 102b . . . 102y, and 102z includes a top plate which is also referred to herein as a first plate. The first plate of each of the capacitors 102a, 102b . . . 102y, and 102z is coupled to the first terminal T1. Each of the capacitors 102a, 102b . . . 102y, and 102z also includes a bottom plate which is also referred to herein as a second plate. Each of the plurality of second plates is coupled to the second terminal T2 (e.g., by a protection device 104a, 104b . . . 104y, and 104z). Each of the second plates is disposed proximate one of the first plates. The first plates and the second plates may be separated from one another by a capacitor dielectric in some embodiments (see capacitor dielectric 130 shown in FIG. 5). A protection device 104a, 104b . . . 104y, and/or 104z is coupled between one of the second plates and the second terminal T2, wherein the protection device 104a, 104b . . . 104y, and/or 104z comprises a redundant capacitor or a fuse, in some embodiments.

Figure 2:
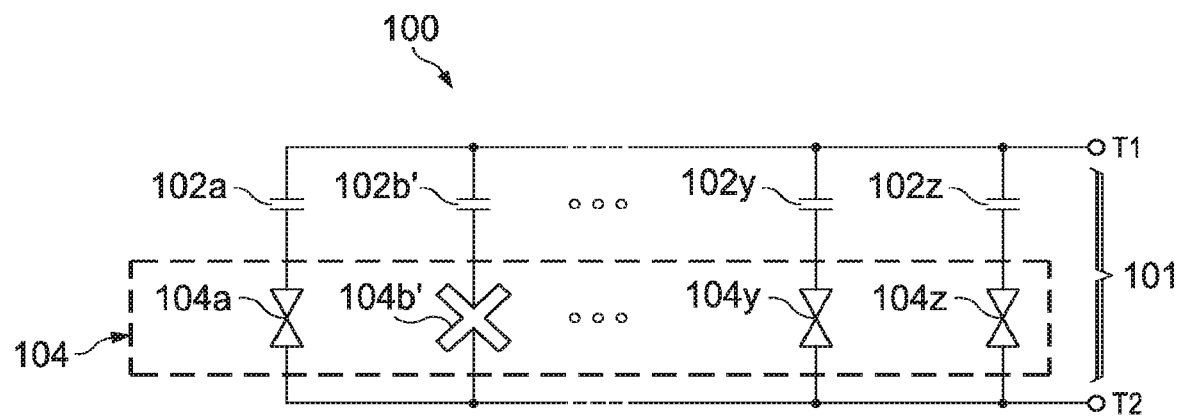
FIG. 2 illustrates the schematic of FIG. 1 after one of the capacitors has failed in accordance with some embodiments.

FIG. 2 illustrates the schematic of FIG. 1 after one of the capacitors 102b' has a failure in accordance with some embodiments. The protection device 104b' coupled in series with the failed capacitor 102b' advantageously prevents the failure of the overall large-area capacitor 101. For example, in an event that the failed capacitor 102b' has an early failure caused by process defects such as particle or pinholes on a capacitor dielectric of the capacitor 102b', a reliability failure during a service life of the semiconductor device 100 in a field application, or other types of failures, a short may form in the failed capacitor 102b'. In some embodiments wherein the protection device 104b' comprises a redundant capacitor, the associated redundant capacitor remains connected and functional in the circuit, protecting the overall large-area capacitor 101 from a catastrophic failure. In embodiments wherein the protection device 104b' comprises a fuse, the fuse is "blown" and turns into an open circuit which also protects the large-area capacitor 101 from a catastrophic failure, because the other capacitors 102a . . . 102y, and 102z are isolated from the failed capacitor 102b' and remain intact and functional.

Figure 3:
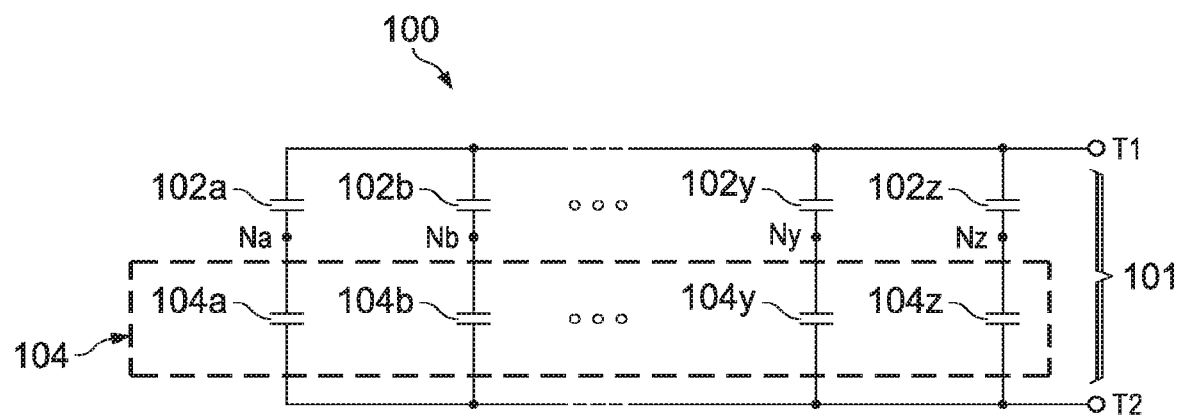
FIG. 3 is a schematic of a semiconductor device wherein the protection devices comprise redundant capacitors in accordance with some embodiments.

FIG. 3 is a schematic of a semiconductor device 100 wherein the protection devices 104a, 104b . . . 104y, and 104z of the protection structure 104 comprise redundant capacitors. The top plates of the redundant capacitors of the protection devices 104a, 104b . . . 104y, and 104z are coupled to the bottom plates of the capacitors 102a, 102b . . . 102y, and 102z at nodes Na, Nb . . . Ny, and Nz, respectively. The bottom plates of the redundant capacitors of the protection devices 104a, 104b . . . 104y, and 104z are coupled to the second terminal T2.

Figure 4:
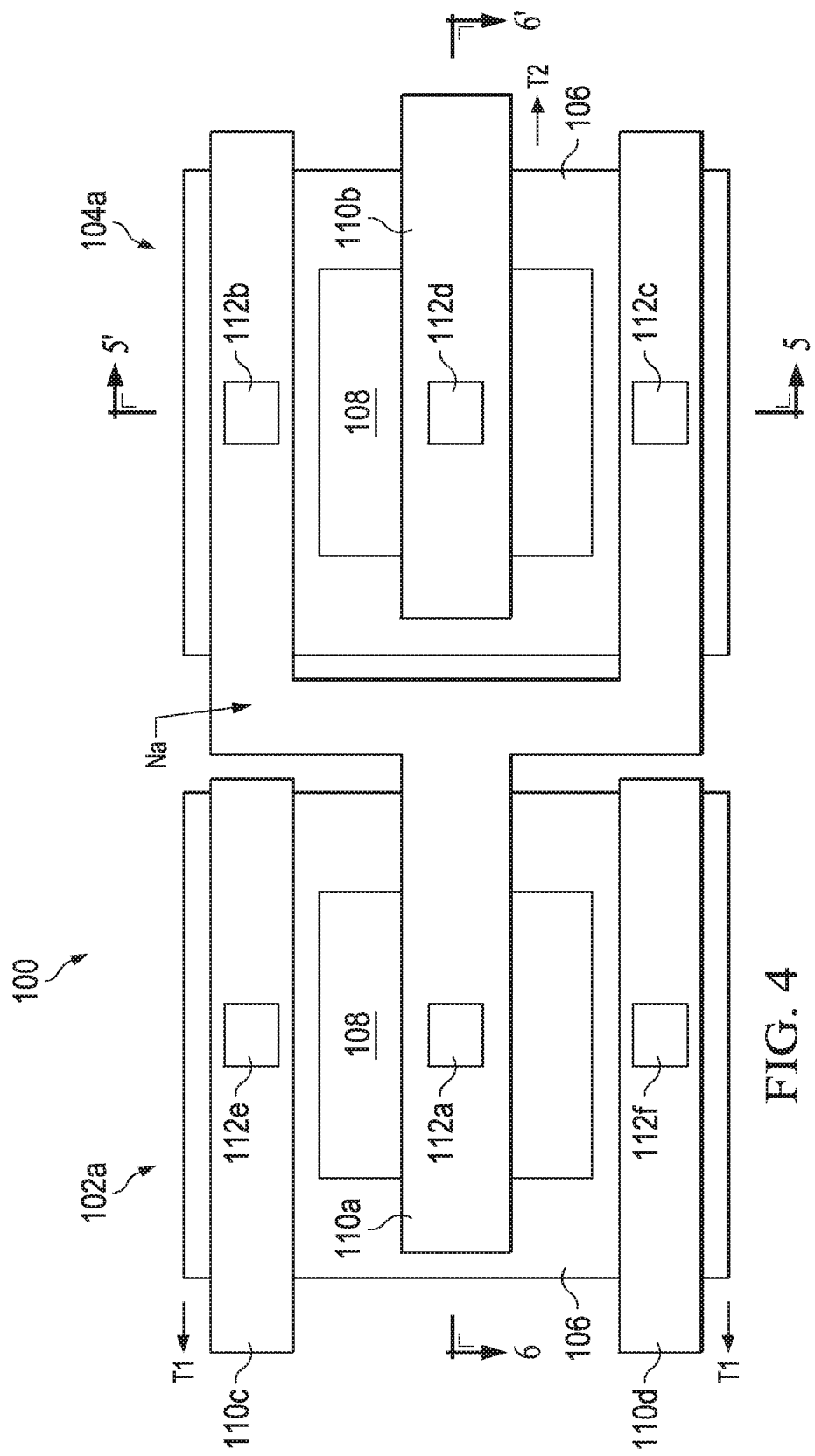
FIG. 4 is a top view of a semiconductor device illustrating a configuration for a protection device comprising a redundant capacitor and a capacitor coupled to the protection device in accordance with some embodiments.
Figure 5:
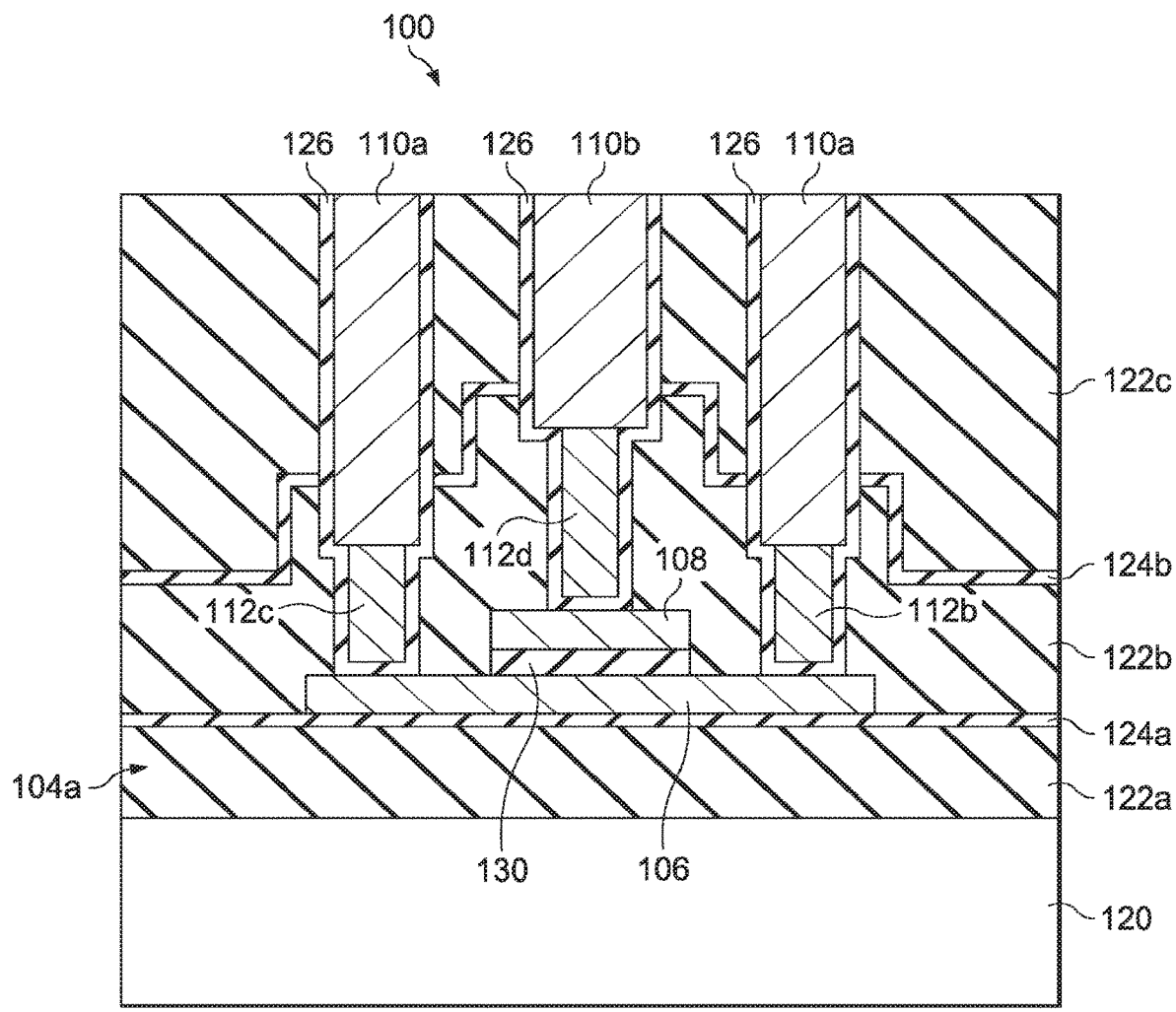
FIG. 5 is a cross-sectional view of the semiconductor device shown in FIG. 4 at view 5-5'.
Figure 6:
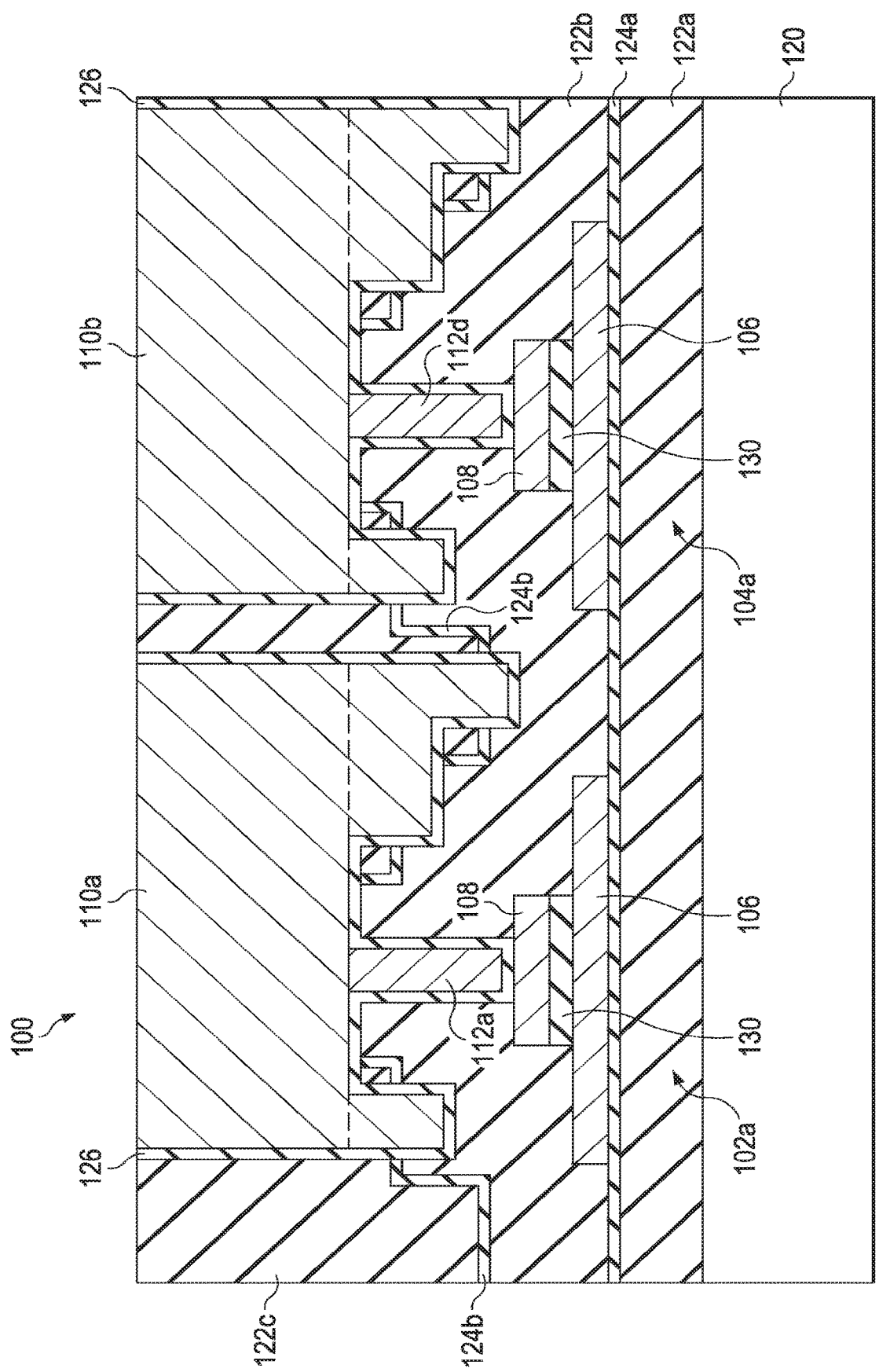
FIG. 6 is a cross-sectional view of the semiconductor device shown in FIG. 4 at view 6-6'.

FIG. 4 is a top view of a semiconductor device 100 illustrating a configuration for a protection device 104a comprising a redundant capacitor and a capacitor 102a coupled to the protection device 104a in accordance with some embodiments. FIG. 5 is a cross-sectional view of the semiconductor device 100 shown in FIG. 4 at view 5-5', and FIG. 6 is a cross-sectional view of the semiconductor device 100 shown in FIG. 4 at view 6-6'. A portion of the large-area capacitor 101 shown in the schematic of FIG. 3 is shown in FIGS. 4, 5, and 6.

The protection device 104a may be formed in the same metallization layers that the capacitor 102a is formed in, as shown in FIG. 6. The protection device 104a may be positioned adjacent, e.g., along-side and/or proximate the capacitor 102a in some embodiments, as shown in FIGS. 4 and 6. Alternatively, the protection device 104a may not be formed in the same metallization layers that the capacitor 102a is formed in, and protection device 104a may be spaced apart from the capacitor 102a in other embodiments, not shown.

The capacitor 102a and protection device 104a comprising the redundant capacitor both include a bottom plate 106, a capacitor dielectric 130 disposed over the bottom plate 106, and a top plate 108 disposed over the capacitor dielectric 130. In some embodiments, the bottom plate 106 and the top plate 108 comprise MIM electrodes, for example. In some embodiments, the bottom plate 106 is larger than the top plate 108 to permit landing of conductive vias on the bottom plate 106 to make electrical connection to the bottom plate 106. For example, conductive vias 112b and 112c are coupled to the bottom plate 106 of the protection device 104b (see FIGS. 4 and 5), and conductive vias 112e and 112f are coupled to the bottom plate of the capacitor 102a (see FIG. 4).

The capacitor 102a and the protection device 104a comprising the redundant capacitor may be coupled together using a conductive line 110a in some embodiments, as shown in FIGS. 4 and 5. The conductive line 110a comprises node Na shown in FIG. 3, for example. The conductive line 110a comprises a pronged shape in the top view in some embodiments. Alternatively, the conductive line 110a may comprise other shapes, and the capacitor 102a and protection device 104a can be coupled together in other configurations and methods. The conductive line 110a is coupled to the top plate 108 of the capacitor 102a by a conductive via 112a and to the bottom plate 106 of the protection device 104b comprising the redundant capacitor by conductive vias 112b and 112c.

The top plate 108 of the protection device 104b is coupled to a conductive line 110b by a conductive via 112d. The conductive line 110b is coupled elsewhere on the semiconductor device 100 to the second terminal T2. The bottom plate 106 of the capacitor 102a is coupled to conductive lines 110c and 110d by conductive vias 112e and 112f, respectively. The conductive lines 110c and 110d are coupled elsewhere on the semiconductor device 100 to the first terminal T1.

In some embodiments, the overall high-area capacitor 101 comprises a high-value capacitor having a capacitance of on the order of hundreds of nano-farads that is comprised of thousands of the capacitors 102a, 102b . . . 102y, and 102z that comprise smaller-area MIM units, for example.

The cross-sectional views shown in FIGS. 5 and 6 illustrate various other material layers and components of the semiconductor device 100 in accordance with some embodiments. To manufacture the semiconductor device 100, first, a workpiece 120 is provided. The workpiece 120 may include a semiconductor substrate comprising silicon or other semiconductor materials and may be covered by an insulating layer, for example. The workpiece 120 may also include other active components or circuits, not shown. The workpiece 120 may comprise silicon oxide over single-crystal silicon, for example. The workpiece 120 may include conductive layers or elements, e.g., transistors, diodes, resistors, inductors, etc., not shown. Compound semiconductors, GaAs, InP, Si/Ge, or SiC, as examples, may be used in place of silicon. The workpiece 120 may comprise a silicon-on-insulator (SOI) or a germanium-on-insulator (GOI) substrate, as examples.

In some embodiments, the workpiece 120 comprises a silicon interposer that is adapted to be used for packaging one or more integrated circuit dies in a 2.5 dimensional (D) or 3D packaging scheme, for example. The workpiece 120 may include wiring and redistribution layers (RDLs), not shown, that are adapted to provide electrical connections between multiple integrated circuit dies coupled to the workpiece 120.

An insulating material layer 122a is formed over the workpiece 120 using a deposition process, and an etch stop layer 124a is formed over the insulating material layer 122a, in some embodiments. The insulating material layer 122a may comprise silicon dioxide, silicon oxynitride, carbon-doped silicon oxide, a spin-on glass, a spin-on polymer, or other insulators, and the etch stop layer 124a may comprise silicon nitride, silicon oxynitride, silicon carbide, oxygen-doped silicon carbide, nitrogen-doped silicon carbide, or other insulators having an etch selectivity to the insulating material layer 122a, as examples. The insulating material layer 122a may comprise a thickness of about 10 nm to about 1,000 nm, and the etch stop layer 124a may comprise a thickness of about 10 nm to about 100 nm, as examples. Alternatively, the insulating material layer 122a and the etch stop layer 124a may comprise other materials and dimensions.

A conductive material such as copper, a copper alloy, or other conductors is formed over the etch stop layer 124a. The conductive material is patterned using a lithography process and etch process to form the bottom plates 106 of the capacitor 102a and the protection device 104a in some embodiments. Alternatively, the bottom plates 106 may be formed using a damascene and/or plating process, by forming an insulating material (e.g., a portion of insulating material layer 122b) over the etch stop layer 124a, patterning the insulating material, and filling the patterned insulating material with a conductive material to form the bottom plates 106. Excess conductive material may be removed from over a top surface of the insulating material using a chemical-mechanical polishing (CMP) process and/or etch process. Each of the bottom plates 106 may comprise a thickness of about 100 nm to about 2,000 nm and a width of about 10 µm to about 500 µm, as examples. Alternatively, the bottom plates 106 may comprise other dimensions.

A capacitor dielectric 130 is formed over the bottom plates 106. The capacitor dielectric 130 may comprise an insulator such as silicon oxide, silicon nitride, silicon oxynitride, silicon carbide, a metal oxide, a polymer, a laminate of a plurality of different dielectric films, or other dielectric materials. The capacitor dielectric 130 may comprise a thickness of about 5 nm to about 50 nm, for example. Alternatively, the capacitor dielectric 130 may comprise other materials and dimensions.

A conductive material comprising similar materials as described for the conductive material of the bottom plates 106 in some embodiments is formed over the capacitor dielectric 130. The conductive material is patterned using lithography to form the top plates 108 of the capacitor 102a and the protection device 104a comprising the redundant capacitor. The capacitor dielectric 130 is also patterned during the etching process used to form the top plates 108 in some embodiments. Alternatively, the capacitor dielectric 130 may be patterned using a separate lithography and etch step, in other embodiments. Each of the top plates 108 may comprise a thickness of about 100 nm to about 2,000 nm and a width of about 10 µm to about 500 µm, as examples. Alternatively, the top plates 108 may comprise other dimensions.

An insulating material layer 122b is formed over the top plates 108, exposed portions of the bottom plates 106, and exposed portions of the etch stop layer 124a. The insulating material layer 122b comprises similar materials and dimensions as described for insulating material layer 122a in some embodiments. The insulating material layer 122b conforms to the shape of the underlying capacitor 102a or protection device 104a in some embodiments, as shown in FIGS. 5 and 6. In other embodiments, the insulating material layer 122b may have a flat top surface or the insulating material layer 122b may be planarized so that it has a flat top surface, not shown.

An etch stop layer 124b comprising similar materials and dimensions as described for etch stop layer 124a is formed over the insulating material layer 122b. An insulating material layer 122c comprising similar materials and dimensions as described for insulating material layers 122a and 122b is formed over the etch stop layer 124b.

The conductive lines 110a, 110b, 110c, and 110d and conductive vias 112a, 112b, 112c, 112d, 112e, and 112f (which are not all shown in FIGS. 5 and 6; see FIG. 4) are formed in the insulating material layer 122c, the etch stop layer 124b, and the insulating material layer 122b using a damascene process which may comprise a single damascene or dual damascene process in some embodiments. For example, the insulating material layer 122c, etch stop layer 124b, and insulating material layer 122b are patterned using a lithography and etch process, and the patterns in the insulating material layer 122c, etch stop layer 124b, and insulating material layer 122b are filled with a conductive material to form the conductive lines 110a, 110b, 110c, and 110d and conductive vias 112a, 112b, 112c, 112d, 112e, and 112f. The conductive lines 110a, 110b, 110c, and 110d and conductive vias 112a, 112b, 112c, 112d, 112e, and 112f may include a liner 126 and a conductive material such as copper or a copper alloy formed over the liner 126, in some embodiments. The liner 126 may comprise a barrier layer and/or seed layer, as examples. In some embodiments, the liner 126 is not included. In some embodiments, the conductive lines 110a, 110b, 110c, and 110d and conductive vias 112a, 112b, 112c, 112d, 112e, and 112f may be formed using subtractive etch processes.

In some embodiments, the conductive lines 110a and 110b (and also the other conductive lines) may include downwardly-extending portions, as shown in FIG. 6, for example, in embodiments wherein the top surface of insulating material layer 122b is not planar. The conductive lines 110a, 110b, 110c, and 110d may comprise a width in a top view of about 0.1 μm to about 10 μm, and the conductive vias 112a, 112b, 112c, 112d, 112e, and 112f may comprise a width in a cross-sectional view of about 0.01 μm to about 1 μm, as examples. In other embodiments, the conductive lines 110a and 110b may not include downwardly-extending portions, e.g., wherein the top surface of insulating material layer 122b comprises a flat surface.

The materials and dimensions described for the workpiece 102, insulating materials 122a, 122b, and 122c, etch stop layers 124a and 124b, bottom and top plates 106 and 108, capacitor dielectric 130, liner 126, and conductive lines 110a, 110b, 110c, and 110d and conductive vias 112a, 112b, 112c, 112d, 112e, and 112f may alternatively comprise other materials and dimensions, in accordance with embodiments of the present disclosure. Likewise, other methods may be used to form the novel large-area capacitor 101 that includes the capacitors 102a and protection devices 104a.

Figure 7:
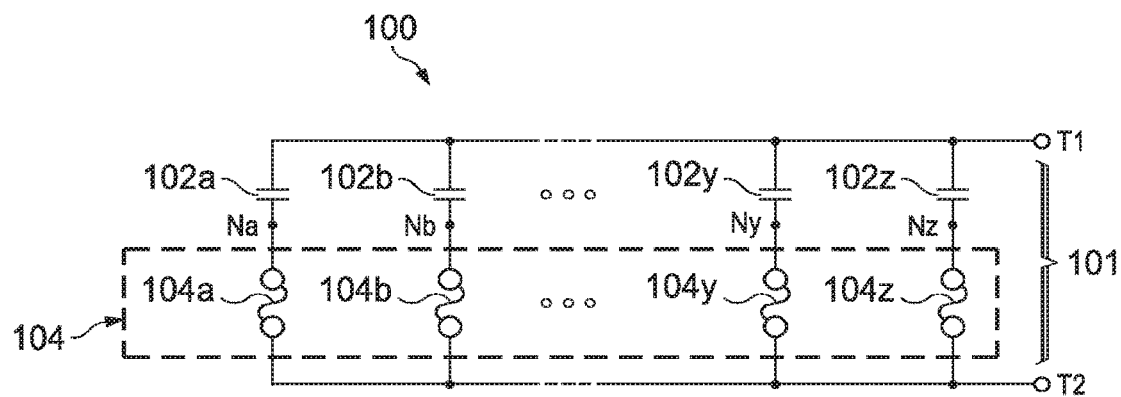
FIG. 7 is a schematic of a semiconductor device wherein the protection devices comprise fuses in accordance with some embodiments.
Figure 8:
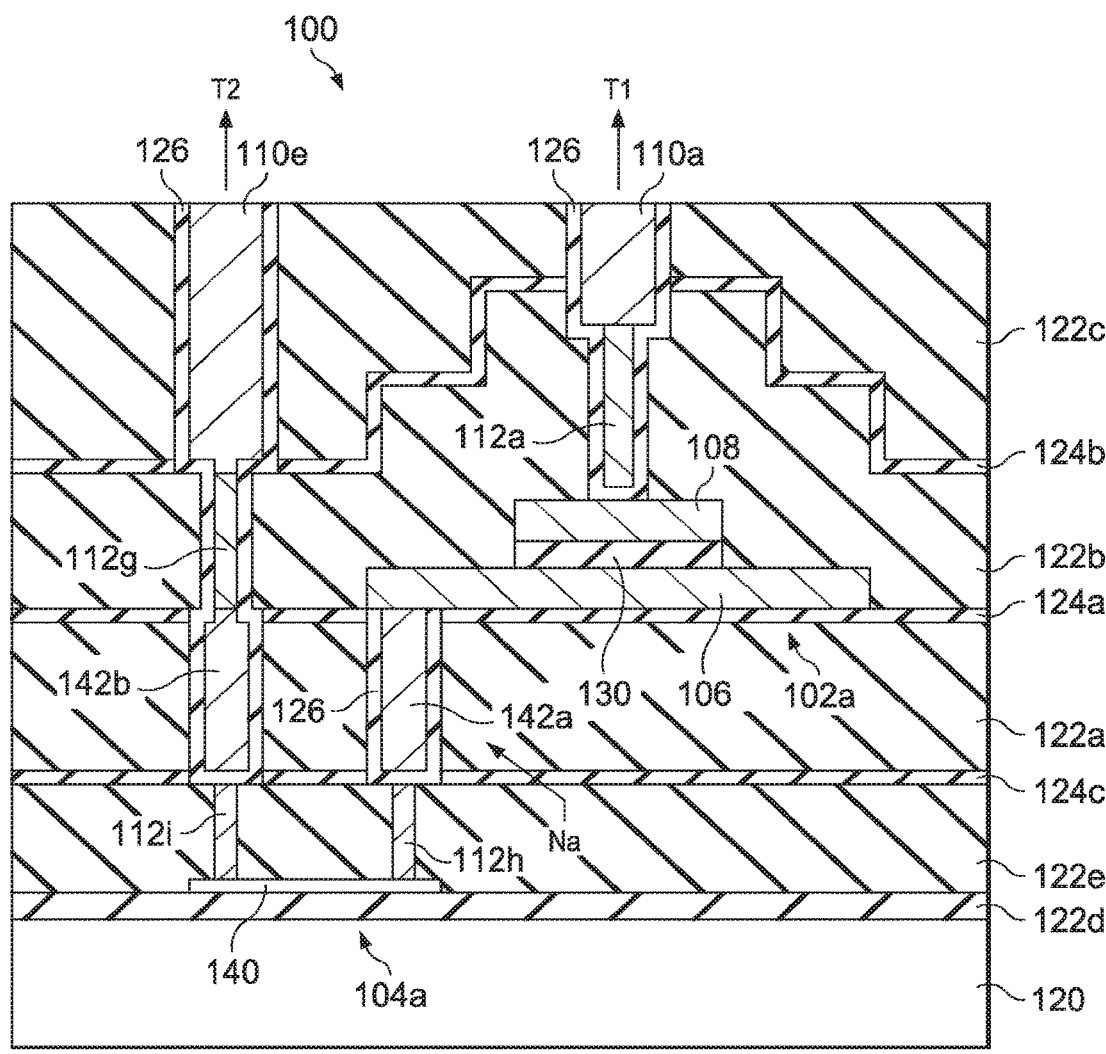
FIG. 8 is a cross-sectional view of a semiconductor device wherein a protection device comprising a fuse comprises a segment of semiconductive material in accordance with some embodiments.
Figure 9:
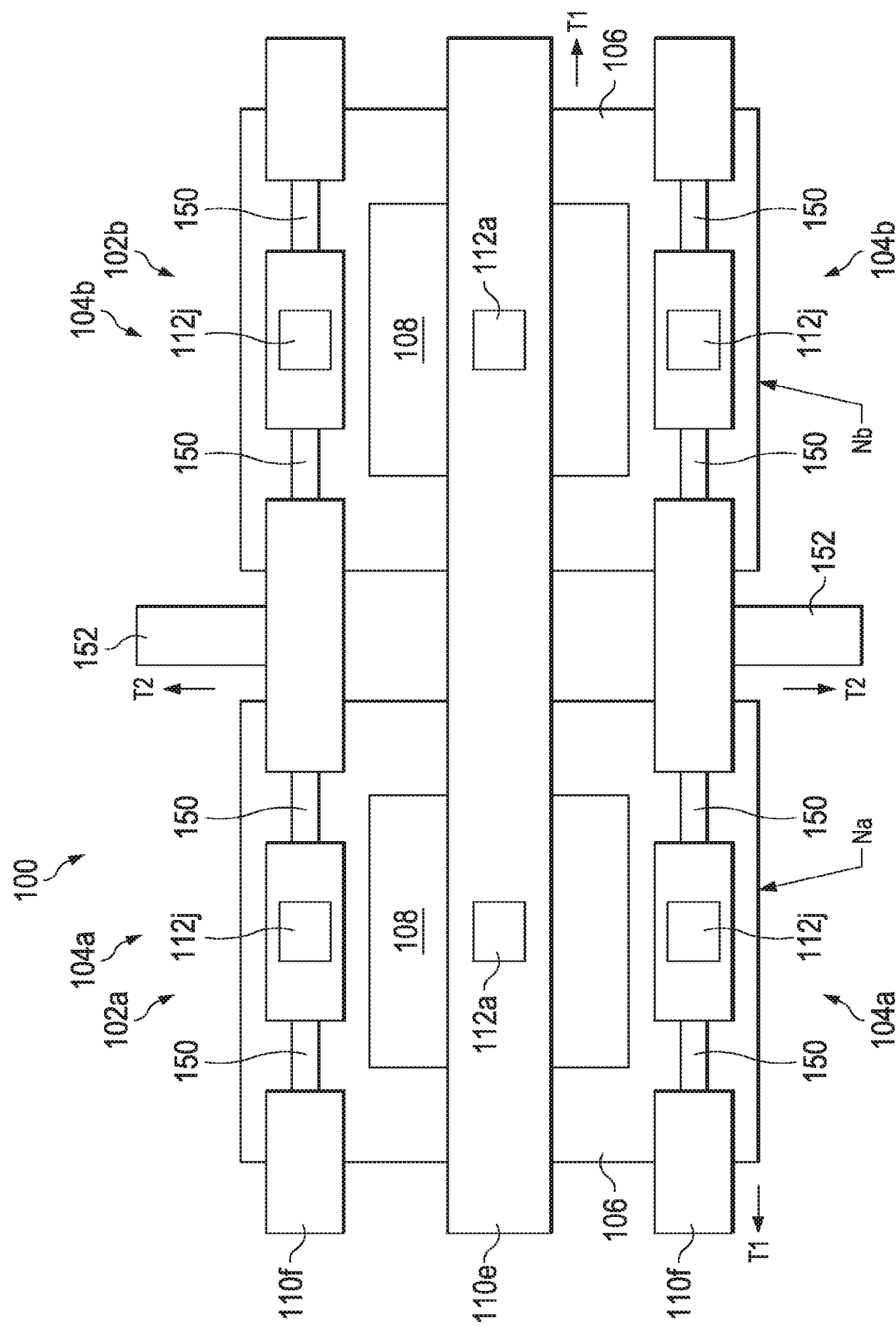
FIG. 9 is a top view of a semiconductor device wherein a protection device comprising a fuse comprises a portion of a conductive line in accordance with some embodiments.
Figure 10:
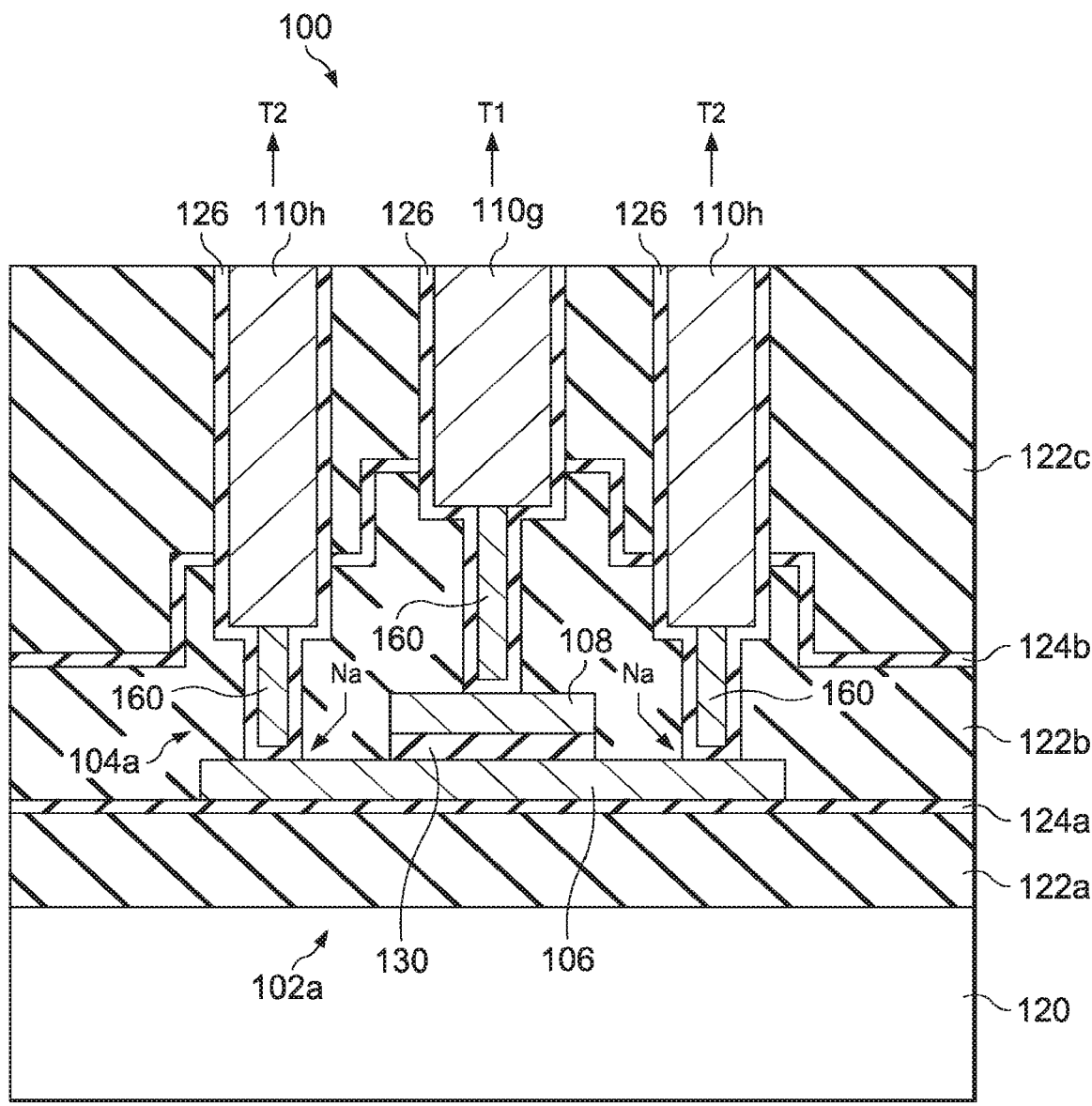
FIG. 10 is a cross-sectional view of a semiconductor device wherein a protection device comprising a fuse comprises a conductive via in accordance with some embodiments.

FIG. 7 is a schematic of a semiconductor device 100 wherein the protection devices 104a, 104b . . . 104y, and 104z of the protection structure 104 of the large-area capacitor 101 comprise fuses in accordance with some embodiments. The fuses may comprise a semiconductive material as shown in FIG. 8, a conductive line as shown in FIG. 9, or a conductive via as shown in FIG. 10, in accordance with some embodiments of the present disclosure. The fuses have a higher resistance than the conductive material of the adjacent elements they are connected to, in some embodiments. The fuses will burn out to form an open circuit if a current higher than a predetermined limit or amount is forced through or passed through them. As a result, if the corresponding capacitor 102a that the fuse protects fails, the failed capacitor 102a is electrically isolated and therefore the overall large-area capacitor 101 continues to perform its intended function.

For example, FIG. 8 is a cross-sectional view of a semiconductor device 100 wherein a protection device 104a comprising a fuse comprises a segment of semiconductive material 140 in accordance with some embodiments. The fuse may be formed in some embodiments by forming an insulating material layer 122d over the workpiece 120, and forming a layer of polysilicon or other type of semiconductive material over the insulating material layer 122d. The layer of semiconductive material is patterned using a lithography process and etch process to form the segment which comprises the semiconductive material. The segment of semiconductive material 140 may comprise width of about 1 nm to about 100 nm, a thickness of about 1 nm to about 50 nm, and a width in a top view (not shown) of about 1 nm to about 100 nm in some embodiments. Alternatively, the segment of semiconductive material 140 may comprise other dimensions. In some embodiments, the dimensions of the fuse comprising the segment of semiconductive material 140 are of a sufficient size so that if the capacitor 102a fails and is electrically shorted, the fuse is 'blown' and is changed to an open position, isolating the failed capacitor 102a from the other capacitors 102b . . . 102y, and 102z of the capacitor 101. Before the capacitor 102a fails, the fuse is in a closed position wherein current may flow through the fuse, for example.

One end of the protection device 104a comprising the segment of semiconductive material 140 is coupled to the bottom plate 106 of the capacitor 102a by a conductive via 112h formed in insulating material layer 122e and a conductive plug 142a which is formed in etch stop layer 124c and insulating material layer 122a. The other opposing end of the segment of semiconductive material 140 is coupled to terminal T2 by a conductive via 112i formed in insulating material layer 122e, a conductive plug 142b formed in etch stop layer 124c, insulating material layer 122a, and etch stop layer 124a, a conductive via 122g formed in insulating material layer 122b, and a conductive plug 110e formed in etch stop layer 124b and insulating material layer 122c. In some embodiments, the segment of semiconductive material 140 is disposed between neighboring capacitor electrodes (e.g., the plates 106 and/or 108), for example.

FIG. 9 shows a top view of a semiconductor device 100 wherein protection device 104a comprise fuses that comprise a portion 150 of a conductive line 110f in accordance with some embodiments. The portions 150 of the conductive lines 110f have a higher resistance than the other portions of the conductive lines 110f because of their decreased width, for example. The portions 150 of the conductive lines 110f have a higher electrical resistance, due to a reduction of the conductive line 110f cross-section, in some embodiments. The conductive lines 110f are coupled to the bottom plates 106 by conductive vias 112j in the embodiments shown. If the capacitor 102a fails, one or more of the portions 150 of the conductive lines 110f will burn out to isolate the faulty capacitor 102a, so that the overall capacitor 101 survives.

Two capacitors 102a and 102b are shown in FIG. 9. Capacitor 102a includes four portions 150 of conductive lines 110f coupled thereto that function as fuses because of their decreased width. The length of the portions 150 in the top view may comprise about 100 nm to about 10 μm in some embodiments. The width of the portions 150 in the top view may comprise about 10 nm to about 1 μm in some embodiments. The thickness of the portions 150 of the conductive lines 110f is substantially the same as the thickness of the conductive lines 110f, which may be about 100 nm to about 2,000 nm in some embodiments, for example. Alternatively, the portions 150 of the conductive lines 110f may comprise other dimensions.

Capacitor 102b also includes four portions 150 of conductive lines 110f coupled thereto that function as a fuse protection device 104b in FIG. 9. Alternatively, the protection devices 104a and 104b may include other numbers of portions 150 of conductive lines; e.g., only one portion 150, or two or more portions 150 of conductive lines may be used as a fuse type of protection device 104a or 104b coupled to a capacitor 102a, 102b . . . 102y, and 102z in accordance with some embodiments. FIG. 9 also illustrates a portion 152 of the conductive lines 110f that may be coupled to terminal T2 in some embodiments. In some embodiments, the narrowed portions 150 of conductive lines 110f with higher resistance are disposed between neighboring capacitor electrodes, for example.

FIG. 10 is a cross-sectional view of a semiconductor device 100 wherein a protection device 104a comprising a fuse comprises one or more conductive vias 160 in accordance with some embodiments. The conductive vias 160 are coupled to the bottom plate 106 and/or top plate 108 of the capacitor 102*a* and have a higher resistance than the plates 106 and 108 and conductive plugs 110*g* and 110*h*, for example. The conductive via or vias 160 are formed within insulating material layer 122*b*. Three conductive vias 160 are shown in FIG. 10; two coupled to the bottom plate 106 of the capacitor 102*a* and one coupled to the top plate 108. The two conductive vias 160 coupled to the bottom plate 106 are coupled to terminal T2 by conductive plugs 110*h* formed within insulating material layer 122*c*, etch stop layer 124*b*, and insulating material layer 122*b*. Note that the conductive via 160 coupled to the top plate 108 is coupled to terminal T1 rather than to terminal T2 and is not shown in the schematic of FIG. 7. The conductive via 160 coupled to the top plate 108 is coupled to terminal T1 by a conductive plug 110*g* formed within insulating material layer 122*c*, etch stop layer 124*b*, and insulating material layer 122*b*.

Only one conductive via 160 may be included in the capacitor 101 as a fuse type of protection device 104*a* in accordance with some embodiments, coupled either to the top plate 108 or the bottom plate 106. Alternatively, the protection device 104*a* may comprise two or more of the conductive vias 160 that function as fuses. The length of the conductive vias 160 may comprise about 10 nm to about 1,000 nm in some embodiments. The width of the conductive vias 160 may comprise about 0.01 μm to about 1 μm in some embodiments. Alternatively, the conductive vias 160 may comprise other dimensions.

The conductive vias 160 may include a liner 126 and may be formed during the formation of conductive plugs 110*g* and 110*h* using a dual damascene process. The conductive vias 160 comprise the same material as the conductive plugs 110*g* and 110*h* in these embodiments. Alternatively, the conductive vias 160 may not include a liner 126. In some embodiments, the conductive vias 160 may be formed in a single damascene process, and may comprise a different material or the same material as the conductive plugs 110*g* and 110*h*. In some embodiments, the conductive vias 160 may comprise a material that is less conductive and has a higher resistance than the material of the conductive lines 110*g* and 110*h*, such as tungsten, aluminum, titanium, tantalum, tantalum nitride, titanium nitride, or other conductors, which is advantageous in that the conductive vias 160 comprising the fuses may more easily "blow" if the capacitor 102*a* fails.

In some embodiments, if the capacitor 102*a* fails, an electrical current forced through one of the conductive vias 160 leads to local burn-out of the conductive via 160 due to Joule's heating, thus causing an open circuit of the conductive via 160, for example.

In some embodiments wherein the conductive vias 160 include a liner 126, the liner 126 may include a barrier layer and/or a seed layer. The barrier layer may comprise a metal and the seed layer may comprise copper in some embodiments, as examples. In some embodiments, a pinch-off may be formed near the end of the formation of a portion of the liner 126 (e.g., comprising the barrier liner and/or seed layer) to form higher electrical resistance conductive vias 160, e.g., due to a decrease of an amount of the barrier layer and/or seed layer in the conductive via 160 which is caused by the pinch-off process. For example, the barrier layer and/or seed layer formation process may have different step coverage capabilities by tuning the process parameters thereof. For a dual damascene structure, the conductive via 160 openings may be closed up (i.e., pinched off) by the barrier layer at the end of barrier layer formation process or by the seed layer at the beginning of seed layer formation process, e.g., so that the seed layer will not be deposited inside the trenches for the conductive vias 160, but will be deposited only inside the trenches for the conductive plugs 110*g* and 110*h*. As a result, in a subsequent electroplating process or other process used to fill the trenches for the conductive vias 160 and the conductive plugs 110*g* and 110*h*, the conductive fill material (i.e., comprising Cu or other type of conductive material) will be deposited only inside the trenches for the conductive plugs 110*g* and 110*h*, but not inside the trenches for the conductive vias 160, therefore forming conductive vias 160 that comprise high-resistance via fuses.

The embodiments shown in FIGS. 9 and 10 are particularly advantageous in some applications, because a minimal manufacturing process flow and/or design change is required to implement the protection devices 104*a* and 104*b*. For example, in FIG. 9, a change in the design of the conductive lines 110*f* to include the portions 150 that have a smaller width than the remainder of the conductive lines 110*f* is all that is required. Similarly, in FIG. 10, a change in the design of conductive vias that would ordinarily be coupled to the bottom plate 106 or top plate 108 (e.g., see conductive vias 112*b*, 112*c*, and 112*d* in FIG. 5) is all that is required, to decrease the width or diameter of the conductive vias 160 or alter the liner 126 or prohibit or limit the formation of the liner 126 so that the vias function as fuses.

Note that in the embodiments shown in FIGS. 7 through 10, the insulating material layers 122*d* and 122*e* may comprise similar materials and dimensions as described for insulating material layers 122*a*, 122*b*, and 122*c* shown in FIGS. 5 and 6. Likewise, the etch stop layer 124*c* may comprise similar materials and dimensions as described for etch stop layers 124*a* and 124*b* shown in FIGS. 5 and 6.

Figure 11:
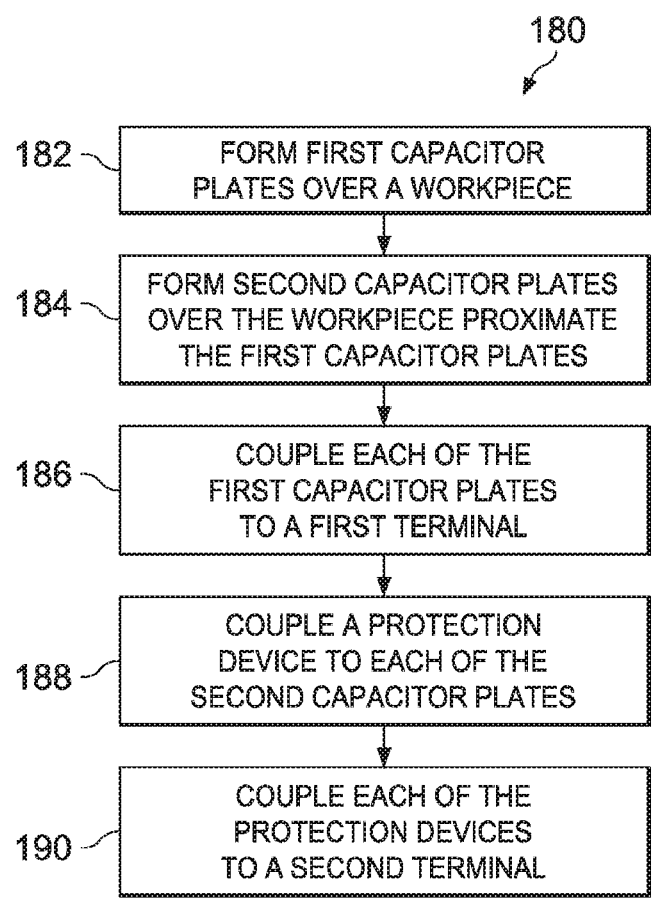
FIG. 11 is a flow chart of a method of manufacturing a semiconductor device in accordance with some embodiments.

FIG. 11 is a flow chart 180 of a method of manufacturing a semiconductor device 100 in accordance with some embodiments. In step 182, first capacitor plates 106 are formed over a workpiece 120 (see also FIG. 6 and FIG. 1; the first capacitor plates comprise the top plates of the capacitors 102*a*, 102*b* . . . 102*y*, and 102*z*). In step 184, second capacitor plates 108 (e.g., comprising the bottom plates of the capacitors 102*a*, 102*b* . . . 102*y*, and 102*z* in FIG. 1) are formed over the workpiece 120 proximate the first capacitor plates 106. In step 186, each of the first capacitor plates is coupled to a first terminal T1 (see also FIG. 1). In step 188, a protection device 104*a*, 104*b* . . . 104*y*, and 104*z* is coupled to each of the second capacitor plates (e.g., comprising the bottom plates of the capacitors 102*a*, 102*b* . . . 102*y*, and 102*z* in FIG. 1). In step 190, each of the protection devices 104*a*, 104*b* . . . 104*y*, and 104*z* is coupled to a second terminal T2.

The order in which the various steps 182, 184, 186, 188, and 190 are performed is not limited to the order illustrated in the flow chart 180 shown in FIG. 11. For example, in some embodiments, i.e., in the embodiments shown in FIGS. 3 through 6, the protection devices 104*a*, 104*b* . . . 104*y*, and 104*z* are formed simultaneously with the formation of the capacitor plates of the capacitors 102*a*, 102*b* . . . 102*y*, and 102*z*. For example, step 188 is formed simultaneously with steps 182 and 184 in some embodiments. In other embodiments, i.e., in the embodiments shown in FIGS. 7 and 8, the protection devices 104*a*, 104*b* . . . 104*y*, and 104*z* comprising a polysilicon fuse 140 are formed before the formation of the capacitor plates of the capacitors 102*a*, 102*b* . . . 102*y*, and 102*z*. For example, step 188 is formed before steps 182 and 184 in some embodiments. In other embodiments, i.e., in the embodiments shown in FIGS. 7 and 10, the protection devices 104a, 104b . . . 104y, and 104z comprising via fuses are formed simultaneously with the coupling of the capacitor plates of the capacitors 102a, 102b . . . 102y, and 102z. For example, step 188 is formed simultaneously with step 186 and also step 190 in some embodiments. Alternatively, the various steps 182, 184, 186, 188, and 190 of the flow chart 180 may be performed before, after, or simultaneously with other steps 182, 184, 186, 188, and 190 and/or other manufacturing process steps of the semiconductor device 100.

Coupling the protection devices 104a, 104b . . . 104y, and 104z comprises coupling a redundant capacitor or a fuse in some embodiments. The plurality of first capacitor plates and the plurality of second capacitor plates comprise a plurality of capacitors 102a, 102b . . . 102y, and 102z coupled together in parallel, and a protection device 104a, 104b . . . 104y, and 104z is coupled in series with each of the plurality of capacitors 102a, 102b . . . 102y, and 102z, in some embodiments.

In some embodiments, the protection devices 104a, 104b . . . 104y, and 104z are coupled below the plurality of second capacitor plates (e.g., below the bottom plates 106 of the capacitors 102a, 102b . . . 102y, and 102z), e.g., in the embodiments shown in FIGS. 7 and 8). In other embodiments, the protection devices 104a, 104b . . . 104y, and 104z are coupled or formed in material layers that the plurality of first capacitor plates and the plurality of second capacitor plates of the capacitors 102a, 102b . . . 102y, and 102z are formed in, e.g., in the embodiments shown in FIGS. 4 through 6. In other embodiments, the protection devices 104a, 104b . . . 104y, and 104z are coupled above the plurality of second capacitor plates of the capacitors 102a, 102b . . . 102y, and 102z, e.g., in the embodiments shown in FIGS. 9 and 10.

In some embodiments, pairs of the first plates and second plates comprise a plurality of capacitive units (e.g., comprising the capacitors 102a, 102b . . . 102y, and 102z), and the protection devices 104a, 104b . . . 104y, and 104z are adapted to self-diagnose and isolate a defaulted one of the plurality of capacitive units.

Some embodiments of the present disclosure include methods of manufacturing semiconductor devices 100, and also include semiconductor devices 100 manufactured using the methods described herein. Some embodiments of the present disclosure also include capacitors 101 that include the protection devices 104a, 104b . . . 104y, and 104z and protection structures 104 described herein.

Advantages of some embodiments of the present disclosure include providing novel capacitors 101 that include the protection structures 104 described herein. The protection structures 104 include one or more protection devices 104a, 104b . . . 104y, and 104z that comprise redundant capacitors or fuses that are placed in series with the capacitors 102a, 102b . . . 102y, and 102z of the overall capacitor 101. The protection structures 104 advantageously provide self-diagnosis and isolation of faulty capacitors 102a, 102b . . . 102y, and 102z and prevent catastrophic failure of the capacitor 101.

In embodiments wherein the protection devices 104a, 104b . . . 104y, and 104z comprise redundant capacitors, if one of the capacitors 102a, 102b . . . 102y, and 102z fails and a short-circuit is formed through the failed capacitor, the redundant capacitor remains connected in parallel with the functioning capacitors 102a, 102b . . . 102y, and 102z so that the capacitor 101 continues to function. In embodiments wherein the protection devices 104a, 104b . . . 104y, and 104z comprise fuses, the fuse structures turn into open circuits in an event of a failure so that the capacitor 101 continues to function.

In some embodiments, a failure of certain capacitors 102a, 102b . . . 102y, and 102z actually results in an increase in the overall capacitance of the capacitor 101, e.g., in embodiments wherein the protection devices 104a, 104b . . . 104y, and 104z comprise redundant capacitors. In other embodiments, a failure of certain capacitors 102a, 102b . . . 102y, and 102z may result in a slight but substantially negligible decrease in the overall capacitance of the capacitor 101, e.g., in embodiments wherein the protection devices 104a, 104b . . . 104y, and 104z comprise fuses.

In some embodiments, the large-area capacitors 101 can be implemented in semiconductor devices that comprise interposer packages for integrated circuits, and the capacitors 101 comprise a high-value decoupling capacitance, e.g., on the order of hundreds of nano-farads, which effectively attenuates voltage fluctuations that may occur due to simultaneous switching of various circuits, for example. The high capacitance value is achieved by coupling together many of the capacitors 102a, 102b . . . 102y, and 102z together in parallel. The novel protection devices 104a, 104b . . . 104y, and 104z provide protection from a complete failure of the large-area capacitor 101 due to a failure of one of the capacitors 102a, 102b . . . 102y, and 102z. If one or more of the capacitors 102a, 102b . . . 102y, and 102z fails, the capacitor 101 continues to function and serve the decoupling purpose.

The protection structure 104 provides a self-protection function for each of the capacitors 102a, 102b . . . 102y, and 102z that can be triggered either by a burn-in screening test in a foundry or in a field application. In an event of a failure of one of the capacitors 102a, 102b . . . 102y, and 102z, the capacitor 101 survives with nearly zero loss of capacitance, (e.g., substantially negligible) due to the large number of the capacitors 102a, 102b . . . 102y, and 102z in the capacitor 101. In embodiments wherein the protection structure 104 comprises fuses, the integration of the protection structure 104 does not degrade capacitance density of the capacitor 101, for example.

Although some embodiments of the present disclosure are particularly advantageous when implemented in large-area capacitors that are used for decoupling, the various embodiments disclosed herein also have application in smaller capacitors, capacitors that are not MIM capacitors, and capacitors that are used for other functions than decoupling, as examples.

Implementing the novel protection structures 104 in capacitors 101 of semiconductor devices 100 results in increased manufacturing yields and longer service life in some applications, by preventing or reducing failures of the capacitors 101. Furthermore, the novel capacitor 101 structures and designs are easily implementable in manufacturing process flows. In some embodiments, no process modifications are needed to implement the protection structure 104, for example.

In accordance with some embodiments of the present disclosure, a semiconductor device includes a first capacitor and a protection device coupled in series with the first capacitor. A second capacitor is coupled in parallel with the first capacitor and the protection device.

In accordance with other embodiments, a capacitor includes a plurality of first plates, each of the plurality of first plates being coupled to a first terminal. The capacitor includes a plurality of second plates. Each of the plurality of second plates is coupled to a second terminal, and each of the second plates is disposed proximate one of the plurality of first plates. A protection device is coupled between one of the plurality of second plates and the second terminal. The protection device comprises a redundant capacitor or a fuse.

In accordance with other embodiments, a method of manufacturing a semiconductor device includes forming a plurality of first capacitor plates over a workpiece, forming a plurality of second capacitor plates over the workpiece proximate the plurality of first capacitor plates, and coupling each of the plurality of first capacitor plates to a first terminal. A protection device is coupled to each of the plurality of second capacitor plates. Each of the protection devices is coupled to a second terminal.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of manufacturing a semiconductor device, the method comprising:
    forming a plurality of first capacitor plates over a workpiece;
    forming a plurality of second capacitor plates over the workpiece and overlapping the plurality of first capacitor plates;
    coupling each of the plurality of first capacitor plates to a first terminal;
    coupling a protection device to each of the plurality of second capacitor plates; and
    coupling each of the protection devices to a second terminal using an electrical conductor, wherein the electrical conductor comprises a conductive line extending along a first side and a second side of the protection device in a top down view of the semiconductor device, and wherein the first side and the second side are directly adjoined at a corner of at least one of the plurality of second capacitor plates.

2. The method according to claim 1, wherein coupling the protection device comprises coupling a redundant capacitor or a fuse.

3. The method according to claim 1, wherein the plurality of first capacitor plates and the plurality of second capacitor plates are part of a plurality of capacitors coupled together in parallel, and wherein coupling the protection device comprises coupling a protection device in series with each of the plurality of capacitors.

4. The method according to claim 1, wherein coupling the protection device comprises coupling the protection device below the plurality of second capacitor plates, and wherein the plurality of second capacitor plates are disposed above the workpiece.

5. The method according to claim 1, wherein coupling the protection device comprises coupling the protection device in material layers that the plurality of first capacitor plates and the plurality of second capacitor plates are formed in.

6. The method according to claim 1, wherein coupling the protection device comprises coupling the protection device above the plurality of second capacitor plates, and wherein the plurality of second capacitor plates are disposed above the workpiece.

7. A method comprising:
    disposing a capacitor in a dielectric layer, the capacitor comprising:
        a plurality of first plates, each of the plurality of first plates being coupled to a first terminal and each of the plurality of first plates being located in a common first metallization layer on a common first plane;
        a plurality of second plates, each of the plurality of second plates being coupled to a second terminal, each of the second plates being disposed over a respective one of the plurality of first plates and each of the plurality of second plates being located in a common second metallization layer on a common second plane; and
        a protection device coupled between one of the plurality of second plates and the second terminal, wherein the protection device comprises a redundant capacitor or a fuse;
    coupling the plurality of second plates to the protection device using an electrical connector, the electrical connector comprising:
        a conductive element located in a third metallization layer different than the first and second metallization layers, the third metallization layer is disposed on a third plane different than the first and second planes; and
        an electrically conductive via extending from the third plane to the second plane, wherein the conductive element is wider than the conductive via in a cross-sectional view; and
    depositing an insulating etch-stop layer over and in direct contact with the dielectric layer, the insulating etch-stop layer being made of a different material than the dielectric layer, wherein the conductive element of the electrical connector extends through the insulating etch-stop layer.

8. The method of claim 7, wherein the insulating etch-stop layer forms a first interface with a first top surface of the dielectric layer and a second interface with a second top surface of the dielectric layer the second interface being higher than the first interface in a cross-sectional view, the insulating etch-stop layer extending continuously from the first top surface of the dielectric layer to the second top surface of the dielectric layer.

9. The method of claim 7, wherein the protection device is disposed along at least two adjoining sides of one of the plurality of first plates.

10. The method of claim 7, wherein the protection device comprises a semiconductive fuse, and wherein the semiconductive fuse is coupled to a bottom surface of the plurality of first plates.

11. The method of claim 10, wherein the semiconductive fuse electrically couples the plurality of first plates to an additional conductive element, the additional conductive element being located in the third metallization layer.

12. The method of claim 7 further comprising:
coupling the plurality of first plates to the protection device using an additional electrical connector, the additional electrical connector comprising:
an additional conductive element located in the third metallization layer; and
an additional electrically conductive via extending from the third plane to the first plane, wherein the additional conductive element is wider than the additional conductive via in a cross-sectional view.

13. The method of claim 7 further comprising disposing a capacitor dielectric between each of the plurality of first plates and each of the plurality of second plates.

14. A method comprising:
coupling a plurality of first plates in a dielectric layer to a first terminal;
coupling a plurality of second plates in the dielectric layer to a second terminal, each of the second plates overlaps one of the plurality of first plates, wherein the plurality of first plates and the plurality of second plates are comprised in a capacitor;
coupling a protection device between one of the plurality of second plates and the second terminal, wherein the protection device comprises a redundant capacitor or a fuse; and
depositing an insulating etch-stop layer over and forming:
a first interface with a first top surface of the dielectric layer; and
a second interface with a second top surface of the dielectric layer the second interface being higher than the first interface in a cross-sectional view, the insulating etch-stop layer extending continuously from the first top surface of the dielectric layer to the second top surface of the dielectric layer.

15. The method according to claim 14, wherein the protection device comprises a fuse, and wherein the fuse comprises a portion of a conductive line, a conductive via, or a segment comprising a semiconductor material.

16. The method according to claim 14, wherein the capacitor comprises a metal-insulator-metal (MIM) capacitor, and wherein the method further comprises forming the capacitor in a plurality of metallization layers of a semiconductor device.

17. The method according to claim 14, wherein the capacitor includes about 1,000 or more of the plurality of first plates or the plurality of second plates.

18. The method according to claim 14, wherein the capacitor comprises a decoupling capacitor.

19. The method according to claim 14, wherein pairs of the plurality of first plates and the plurality of second plates define a plurality of capacitive units, and wherein the method further comprises adapting the protection device to self-diagnose and isolate a defaulted one of the plurality of capacitive units.

20. The method according to claim 14 further comprising:
forming a first plurality of conductive vias extending through the insulating etch-stop layer to the plurality of first plates; and
forming a second plurality of conductive vias extending through the insulating etch-stop layer to the plurality of second plates.

* * * * *